US008409948B2

(12) United States Patent
Fischer et al.

(10) Patent No.: US 8,409,948 B2
(45) Date of Patent: *Apr. 2, 2013

(54) METHODS OF FORMING TRANSISTORS, AND METHODS OF FORMING MEMORY ARRAYS

(75) Inventors: Mark Fischer, Meridian, ID (US); Sanh D. Tang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/485,892

(22) Filed: May 31, 2012

(65) Prior Publication Data

US 2012/0238061 A1 Sep. 20, 2012

Related U.S. Application Data

(63) Continuation of application No. 12/872,705, filed on Aug. 31, 2010, now Pat. No. 8,207,032.

(51) Int. Cl.
*H01L 21/8242* (2006.01)
*H01L 21/8238* (2006.01)
(52) U.S. Cl. .................... 438/242; 438/206; 438/209
(58) Field of Classification Search .............. 438/242, 438/206, 209
See application file for complete search history.

(56) References Cited

U.S. PATENT DOCUMENTS

| 5,929,477 A * | 7/1999 | McAllister et al. ........... 257/306 |
| 6,207,494 B1 | 3/2001 | Graimann et al. |
| 6,486,038 B1 | 11/2002 | Maszara et al. |
| 6,610,573 B2 | 8/2003 | Weis |
| 7,183,164 B2 | 2/2007 | Haller |
| 7,202,523 B2 | 4/2007 | Forbes |
| 7,244,987 B2 | 7/2007 | Forbes |
| 7,326,611 B2 | 2/2008 | Forbes |
| 7,372,091 B2 | 5/2008 | Leslie |
| 7,586,149 B2 * | 9/2009 | Yoon et al. ..................... 257/329 |
| 7,795,620 B2 | 9/2010 | Huang |
| 7,935,598 B2 * | 5/2011 | Lee .............................. 438/268 |

* cited by examiner

*Primary Examiner* — Luan C Thai
(74) *Attorney, Agent, or Firm* — Wells St. John P.S.

(57) ABSTRACT

Some embodiments include methods of forming vertical transistors. A construction may have a plurality of spaced apart fins extending upwardly from a semiconductor substrate. Each of the fins may have vertical transistor pillars, and each of the vertical transistor pillars may have a bottom source/drain region location, a channel region location over the bottom source/drain region location, and a top source/drain region location over the channel region location. Electrically conductive gate material may be formed along the fins while using oxide within spaces along the bottoms of the fins to offset the electrically conductive gate material to be above the bottom source/drain region locations of the vertical transistor pillars. The oxide may be an oxide which etches at a rate of at least about 100 Å/minute with dilute HF at room temperature. In some embodiments the oxide may be removed after the electrically conductive gate material is formed.

22 Claims, 19 Drawing Sheets

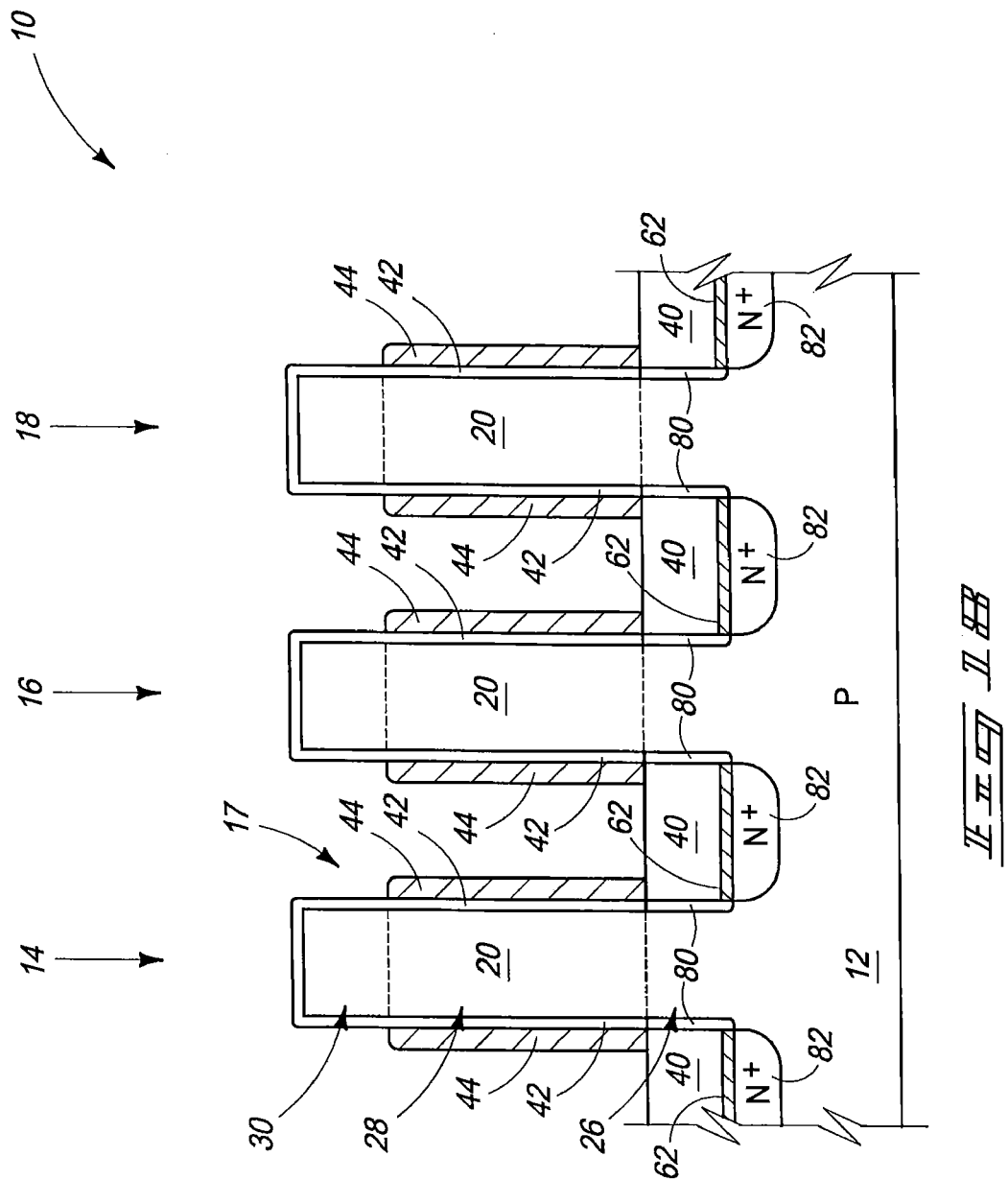

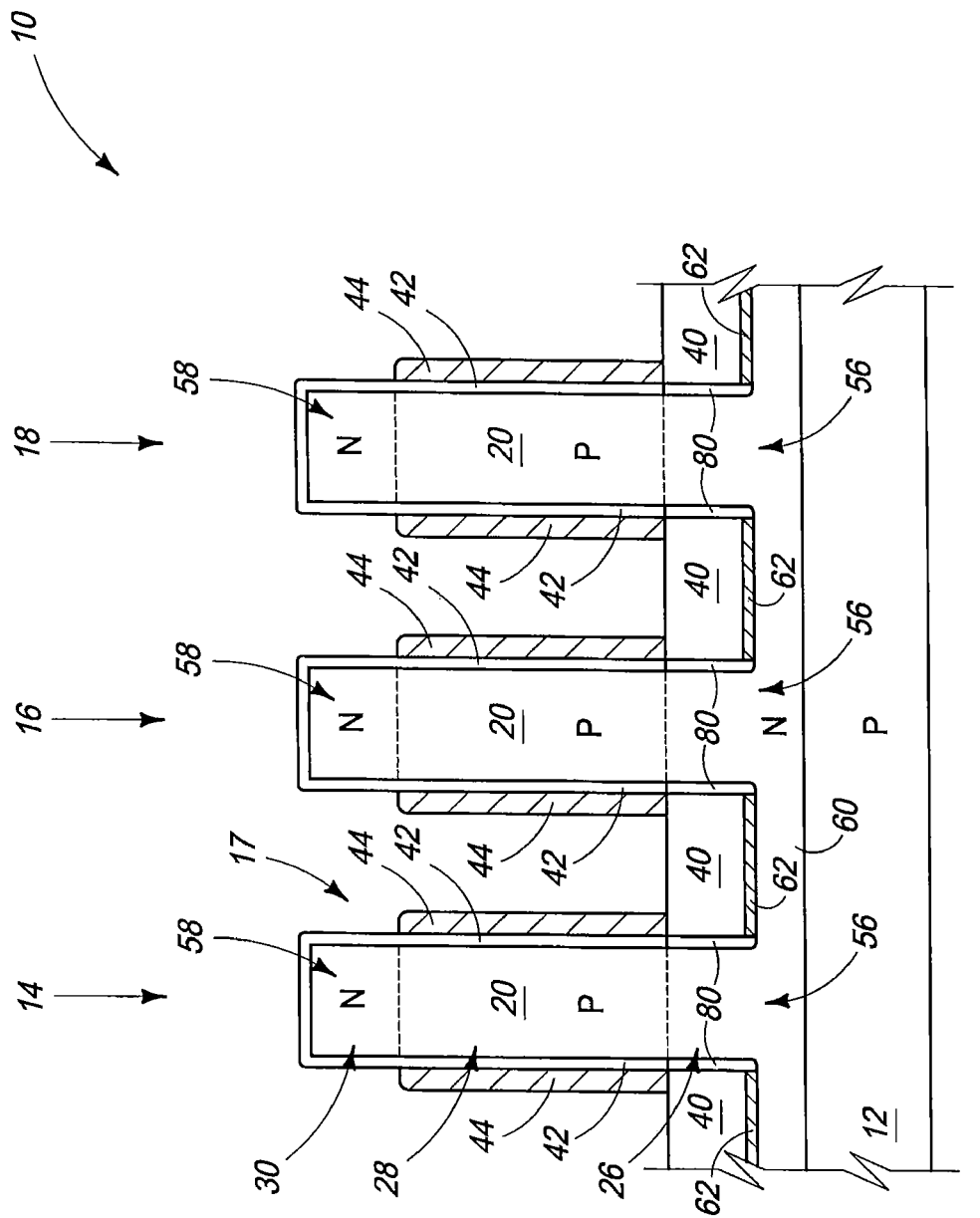

US 8,409,948 B2

METHODS OF FORMING TRANSISTORS, AND METHODS OF FORMING MEMORY ARRAYS

RELATED PATENT DATA

This patent resulted from a continuation of U.S. patent application Ser. No. 12/872,705, which was filed Aug. 31, 2010, which is now U.S. Pat. No. 8,207,032, and which is hereby incorporated herein by reference.

TECHNICAL FIELD

Methods of forming pluralities of vertical transistors, and methods of forming memory arrays.

BACKGROUND

Vertical transistors are attracting substantial interest for utilization in highly integrated circuitry. Vertical transistors have source, drain and channel regions arranged along a vertical axis. Vertical transistors may thus have a relatively small footprint over an underlying semiconductor substrate as compared to conventional transistors having source, drain and channel regions arranged along a horizontal axis.

A continuing goal of integrated circuit fabrication is to increase the level of integration. Related goals are to decrease the size of individual circuit components, and to decrease the spacings between individual circuit components.

Vertical transistors often comprise source, drain and channel regions arranged in a vertically-projecting pillar of semiconductor material, and comprise a transistor gate along an outer surface of such pillar. The transistor gates of the vertical transistors are thus within spaces between semiconductor material pillars. In theory the pillars can be formed to be tightly packed while still enabling functional vertical transistors to be constructed. However, in practice it is found to be difficult to form the gates of vertical transistors within tight spaces between the transistors. Accordingly, the size of the spaces between the transistors can be dictated by limitations of a fabrication process, rather than by the performance characteristics of the transistor devices. It would be desirable to develop new methods for fabrication of vertical transistors which can enable gates of such transistors to be formed within tighter spaces between the semiconductor material pillars of the transistors.

BRIEF DESCRIPTION OF THE DRAWINGS

FIGS. 13-19 are diagrammatic cross-sectional views of a semiconductor construction shown at various process stages of another example embodiment method of forming vertical transistors and a memory array. The process stage of FIG. 13 may follow that of FIG. 1.

DETAILED DESCRIPTION OF THE ILLUSTRATED EMBODIMENTS

Some embodiments include methods in which vertical semiconductor material pillars are formed over a substrate, and oxide is provided at the bottoms of spaces between adjacent pillars. The pillars are incorporated into vertical transistors. Each vertical transistor may comprise a bottom source/drain region within the semiconductor material pillar, a top source/drain region within the pillar, and a channel region between the top and bottom source/drain regions. The oxide may be utilized during fabrication of transistor gates within spaces between the pillars, and specifically may be utilized to offset the gates relative to the bottom source/drain regions. Some embodiments may enable vertical transistors to be fabricated with tight spaces between adjacent pillars. In some embodiments such spaces may have aspect ratios of from about 8:1 to about 10:1, and in some embodiments the spaces may have aspect ratios of even greater than about 10:1.

Example embodiments are described with reference to FIGS. 1-19.

Figure 1:
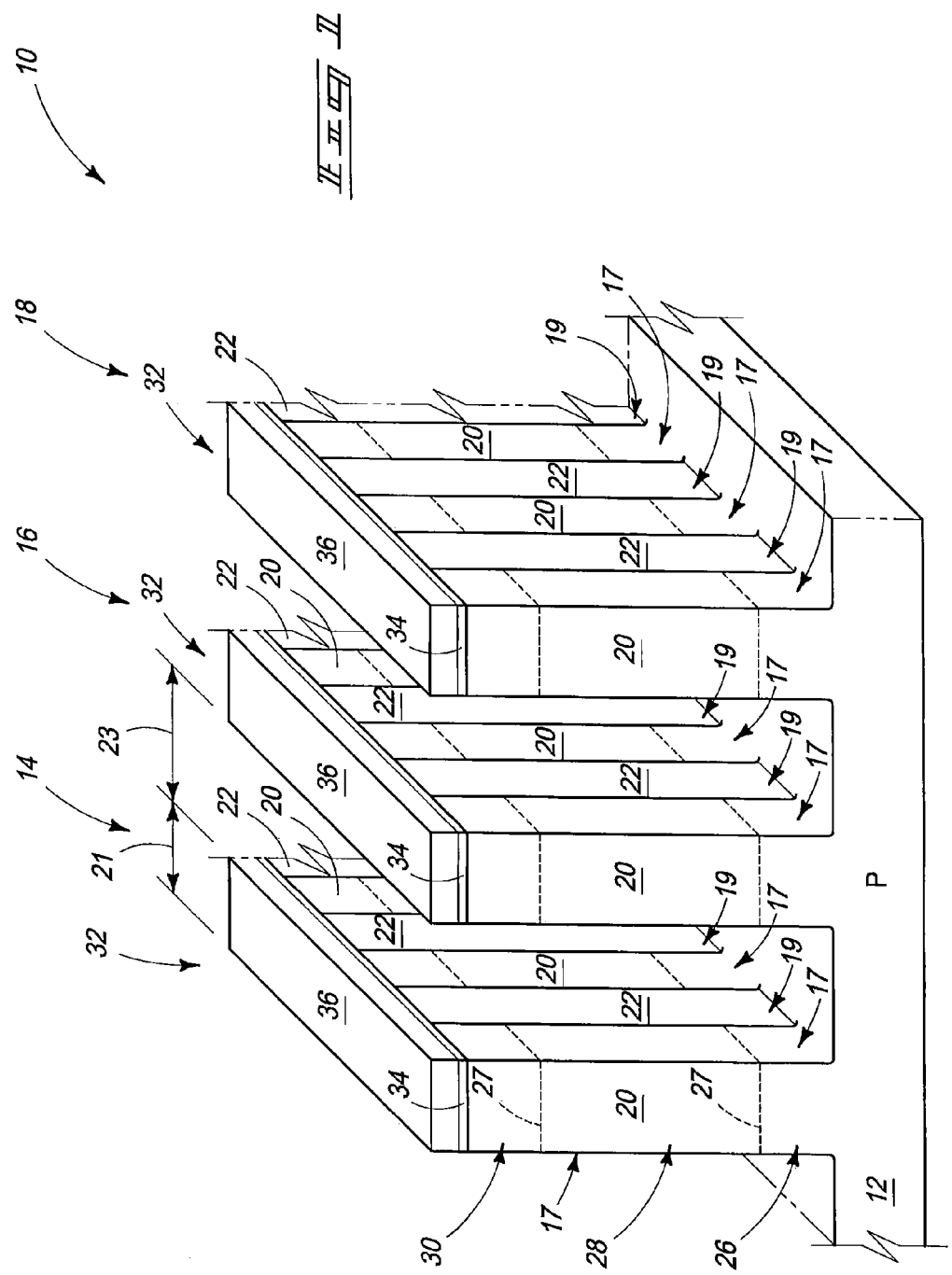
FIGS. 1-11 are three-dimensional views of a semiconductor construction shown at various process stages of an example embodiment method of forming vertical transistors and a memory array.

Referring to FIG. 1, a portion of a semiconductor construction 10 is illustrated. Construction 10 comprises a base 12 of semiconductor material, and comprises a plurality of spaced apart fins 14, 16 and 18 extending upwardly from the base.

Base 12 may comprise, consist essentially of or consist of monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 12 is shown to be homogenous, the base may comprise numerous layers in some embodiments. For instance base 12 may correspond to a semiconductor substrate containing one or more layers associated with integrated circuit fabrication. In such embodiments, such layers may correspond to one or more of refractory metal layers, barrier layers, diffusion layers, insulator layers, etc.

Base 12 is shown to be p-type background doped. In other embodiments the base may be n-type background doped, or at least may comprise an n-well in the region beneath the fins 14, 16 and 18. In some embodiments base 12 may be part of a semiconductor-on-insulator (SOI) construction, and accordingly the semiconductor material of base 12 may be supported over an insulative material (not shown).

Each of the fins 14, 16 and 18 comprises vertical transistor pillars 17 (only some of which are labeled) alternating with dielectric material pillars 19 (only some of which are labeled). The vertical transistor pillars comprise semiconductor material 20, and the dielectric material pillars comprise dielectric material 22. The fins 14, 16 and 18 may be formed by conventional methods utilized for fabricating vertical transistor structures.

The semiconductor material 20 may comprise any suitable composition, such as, for example, monocrystalline silicon. In the shown embodiment the semiconductor material 20 of the vertical pillars merges with the semiconductor material of base 12, as would be the case in some embodiments in which the semiconductor material 20 is the same composition as the semiconductor material of the base. In other embodiments the semiconductor material 20 of the vertical pillars may be of a different composition than the semiconductor material of the base.

The dielectric material 22 may comprise any suitable composition, and in some embodiments may comprise, consist essentially of or consist of silicon dioxide.

The fins 14, 16 and 18 are shown to have widths 21, and to be spaced from one another by distances 23 which are somewhat greater than the widths 21. The relative dimensions of widths 21 and distances 23 are for illustrative purposes only. Specifically, subsequent fabrication stages discussed below with reference to FIGS. 2-12 form various materials within the spaces between the fins, and accordingly the distances 23 are illustrated to be large enough to enable drawing of the subsequently-formed materials within the spaces. In practice the distances 23 (i.e., the widths of the spaces between the fins) may be comparable to the widths 21 of the fins; and both may be about a minimum dimension that can be formed with the processing utilized to fabricate construction 10.

Each of the vertical transistor pillars is shown to be subdivided into three segments 26, 28 and 30 along a vertical axis of the pillar (the segments are only labeled relative to one of the vertical transistor pillars). Dashed lines 27 (only labeled relative to one of the vertical transistor pillars) are utilized to diagrammatically illustrate boundaries between the segments 26, 28 and 30. The segments 26 correspond to locations where bottom source/drain regions will be formed within the vertical transistor pillars 17, the segments 28 correspond to locations where channel regions will be formed within the vertical transistor pillars, and the segments 30 correspond to locations where top source/drain regions will be formed within the vertical transistor pillars.

In some embodiments the vertical transistor pillars may be doped at the processing stage of FIG. 1 so that segments 28 have channel-type doping provided therein and/or so that one or both of segments 26 and 30 have source/drain doping provided therein. In other embodiments at least some of the doping of one or more of the segments 26, 28 and 30 may be conducted at one or more processing stages subsequent to the stage of FIG. 1.

Each of the fins 14, 16 and 18 is shown to have a sacrificial cap 32 provided thereover. The caps comprise hard masking material utilized during the fabrication of fins 14, 16 and 18. In the shown embodiment each of the caps comprises silicon nitride 36 over pad oxide 34.

Figure 2:
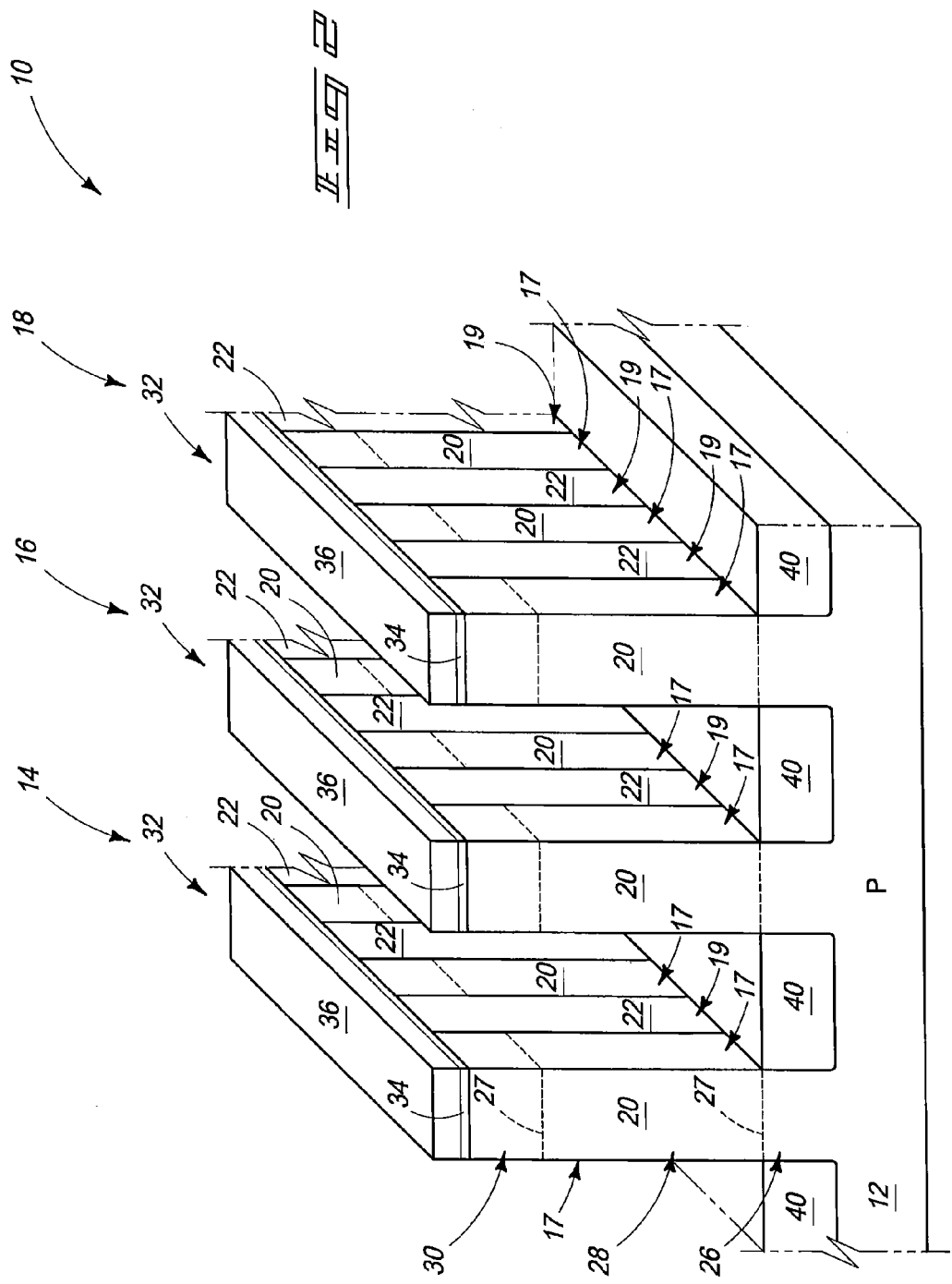

Referring to FIG. 2, an oxide 40 is formed within the spaces between fins 14, 16 and 18. The oxide 40 is formed to a height within the spaces such that the oxide covers the bottom source/drain segments 26 of the vertical transistor pillars 17, and leaves other segments of the vertical transistor pillars exposed.

The oxide 40 is utilized to elevationally offset an electrically conductive gate material (described below with reference to FIG. 3) to be above the bottom source/drain segments 26. The oxide 40 may comprise, consist essentially of, or consist of silicon dioxide. Preferably the oxide 40 is easily removed, and in some embodiments the oxide 40 may consist of silicon dioxide that can be etched at a rate of at least 100 Å/minute with dilute HF at room temperature. The term "dilute HF" refers to a hydrofluoric acid solution containing water and HF; with the ratio of water to HF being about 500:1 (volume to volume) in embodiments in which the HF was at a concentration of from about 48.8-49.2 (wt. %) prior to the dilution with the deionized water. In some embodiments the dilute HF may consist of deionized water and HF.

The oxide 40 may be formed between fins 14, 16 and 18 with any suitable processing. In some embodiments the fins 14, 16 and 18 may be tightly packed so that the spaces between the fins are very narrow. In such embodiments it may be advantageous to form oxide 40 with a bottom-up deposition method, such as, for example, utilization of gas cluster ion beam (GCIB) processing. However, it may also be possible to form oxide 40 with more conventional processing; such as, for example, deposition of material 40 with one or both of atomic layer deposition (ALD) and chemical vapor deposition (CVD) to fill the spaces between fins 14, 16 and 18, followed by an etch-back of material 40 to reduce the height of material 40 within the spaces to the shown desired elevation.

Figure 3:
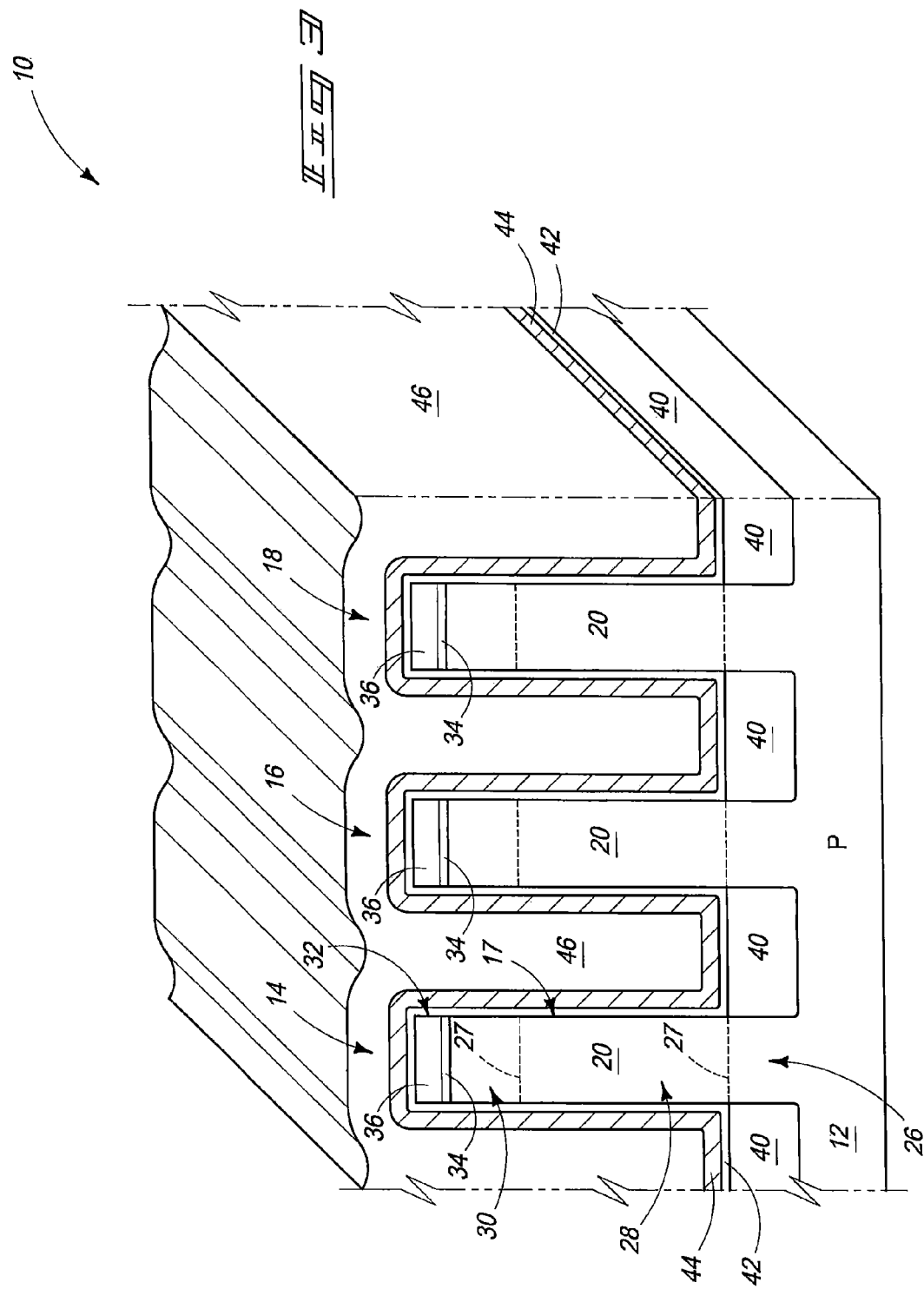

Referring to FIG. 3, gate dielectric material 42 is formed over and between fins 14, 16 and 18; and electrically conductive gate material 44 is formed over the gate dielectric. In some embodiments a layer comprising, consisting essentially of, or consisting of silicon nitride (not shown) may be formed over oxide 40 prior to formation of the gate dielectric 42 and the electrically conductive gate material 44. Such silicon nitride may protect exposed surfaces of the gate dielectric and the electrically conductive gate material after subsequent removal of oxide 40 (discussed below with reference to FIG. 8). If the silicon nitride layer is formed over oxide 40, such silicon nitride layer may be relatively thin, and may, for example, have a thickness of less than or equal to about 50 Å.

The gate dielectric material 42 may comprise any suitable composition or combination of compositions, and in some embodiments may comprise, consist essentially of, or consist of silicon dioxide. Although the gate dielectric material is shown formed after formation of oxide 40, in other embodiments at least some of the gate dielectric material may be formed prior to formation of oxide 40. If the gate dielectric is formed prior to formation of oxide 40, the gate dielectric may extend to the bottoms of the spaces between fins 14, 16 and 18 to line such spaces prior to formation of oxide 40.

Electrically conductive gate material 44 may comprise any suitable composition or combination of compositions, and in some embodiments may comprise, consist essentially of or consist of one or more of various metals (for instance, tungsten, titanium, platinum, etc.), metal-containing compositions (for instance, metal silicide, metal nitride, etc.), and conductively-doped semiconductor materials (for instance, conductively-doped silicon, conductively-doped germanium, etc.).

The electrically conductive gate material 44 is along the channel segments 28 and the top source/drain segments 30 of the vertical transistor pillars 17, and is elevationally offset from the bottom source/drain segments 26 of the vertical transistor pillars by the oxide 40.

The electrically conductive gate material 44 lines the spaces between fins 14, 16 and 18, and thus narrows such spaces. Sacrificial material 46 is formed within such narrowed spaces. Sacrificial material 46 may comprise any suitable composition or combination of compositions, and in some embodiments may comprise, consist essentially of, or consist of silicon dioxide. In some embodiments oxide 40 is a sacrificial material, and the sacrificial materials 40 and 46 may be referred to as first and second sacrificial materials, respectively, to distinguish them from one another. The sacrificial material 46 may be provided to a thickness of slightly greater than ½ of the widths 23 (FIG. 1) of the spaces so that the material coalesces within the spaces to fill the spaces.

Figure 4:
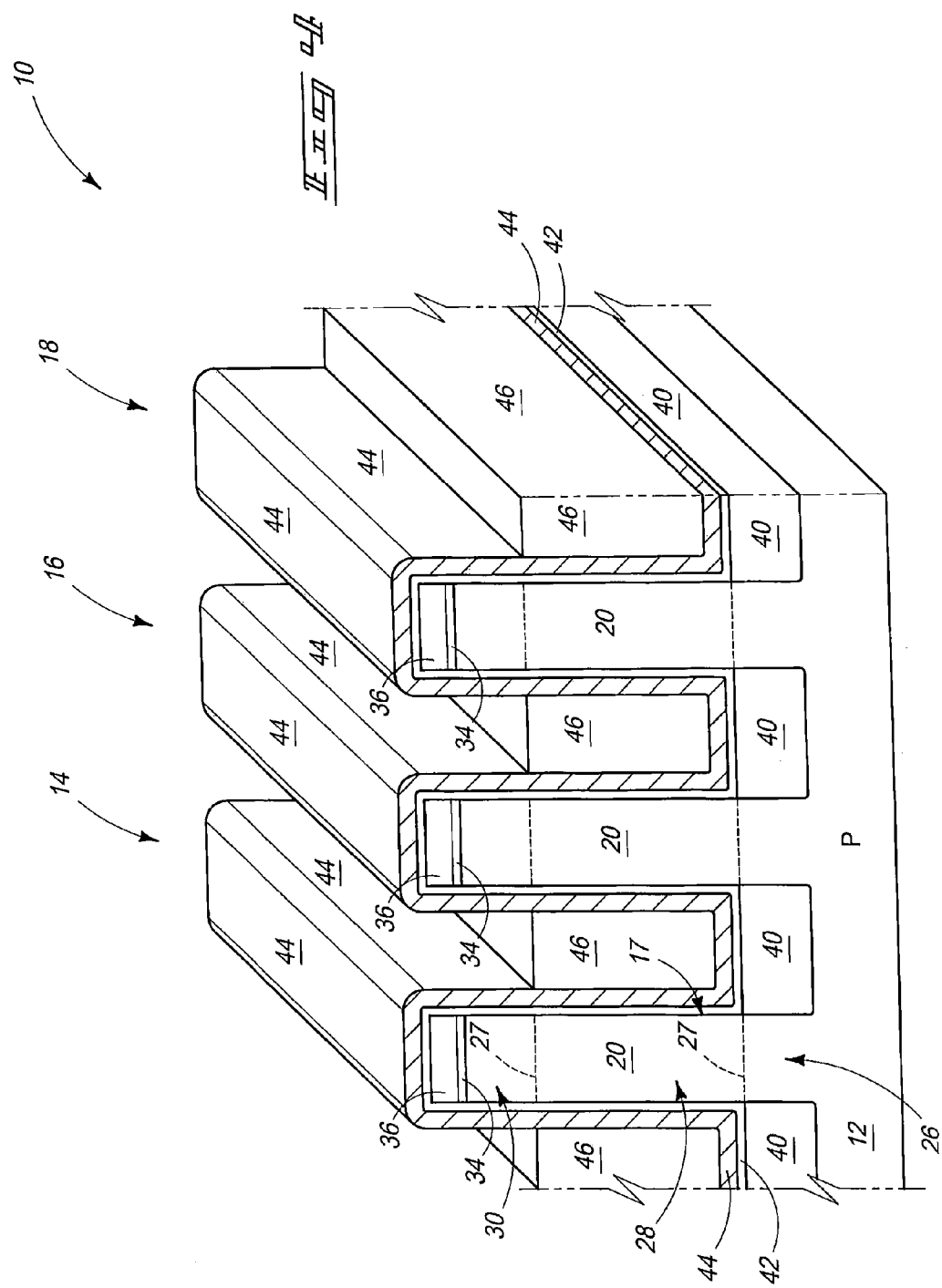

Referring to FIG. 4, sacrificial material 46 is etched back to expose upper portions of fins 14, 16 and 18. In the shown embodiment sacrificial material 46 is etched back to about the elevational level of the interfaces between channel segments 28 and top source/drain segments 30 within the vertical transistor pillars 17.

Figure 5:
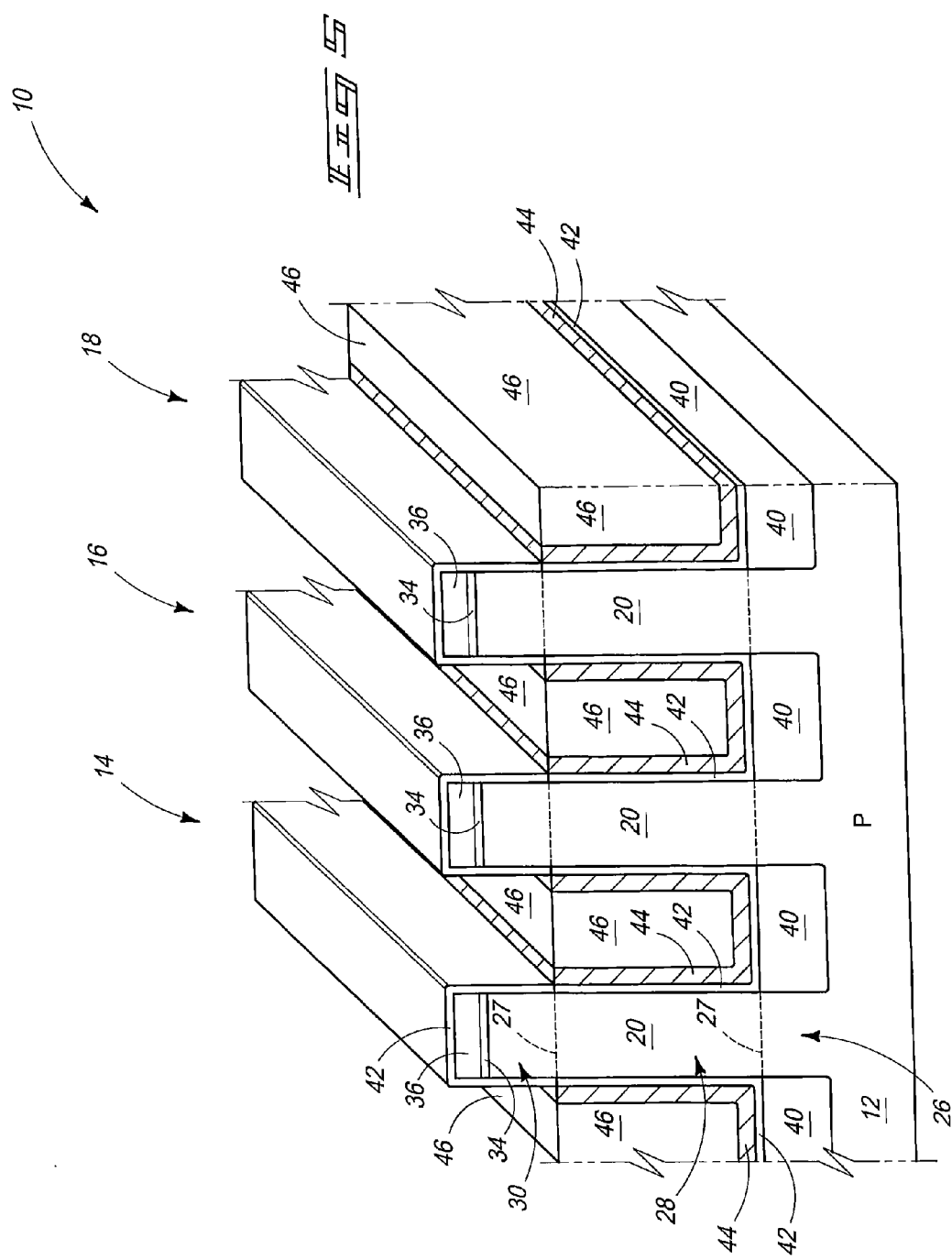

Referring to FIG. 5, the etched back sacrificial material 46 is utilized as a mask during an etch-back of electrically conductive gate material 44. The etch-back of material 44 exposes dielectric material 42 along upper portions of fins 14, 16 and 18.

The shown embodiment of FIGS. 4 and 5 has sacrificial material 46 etched back in a first step, and then utilized as a mask during the etching back of electrically conductive gate material 44 in a second step. In other embodiments the sacrificial material 46 and the electrically conductive gate material 44 may be etched back together in a single etch, rather than being etched back sequentially.

The embodiment of FIG. 5 shows the conductive gate material 44 etched back to a same elevation as the sacrificial material 46. In other embodiments the gate material 44 may be etched back to a level less than that of sacrificial material 46, or to a level greater than that of sacrificial material 46.

The etching back of the electrically conductive gate material forms the gate material into a gate structure which is along the channel segments 28 of the vertical transistor pillars 17, and not along the top source/drain segments 30 of such vertical transistor pillars.

Figure 6:
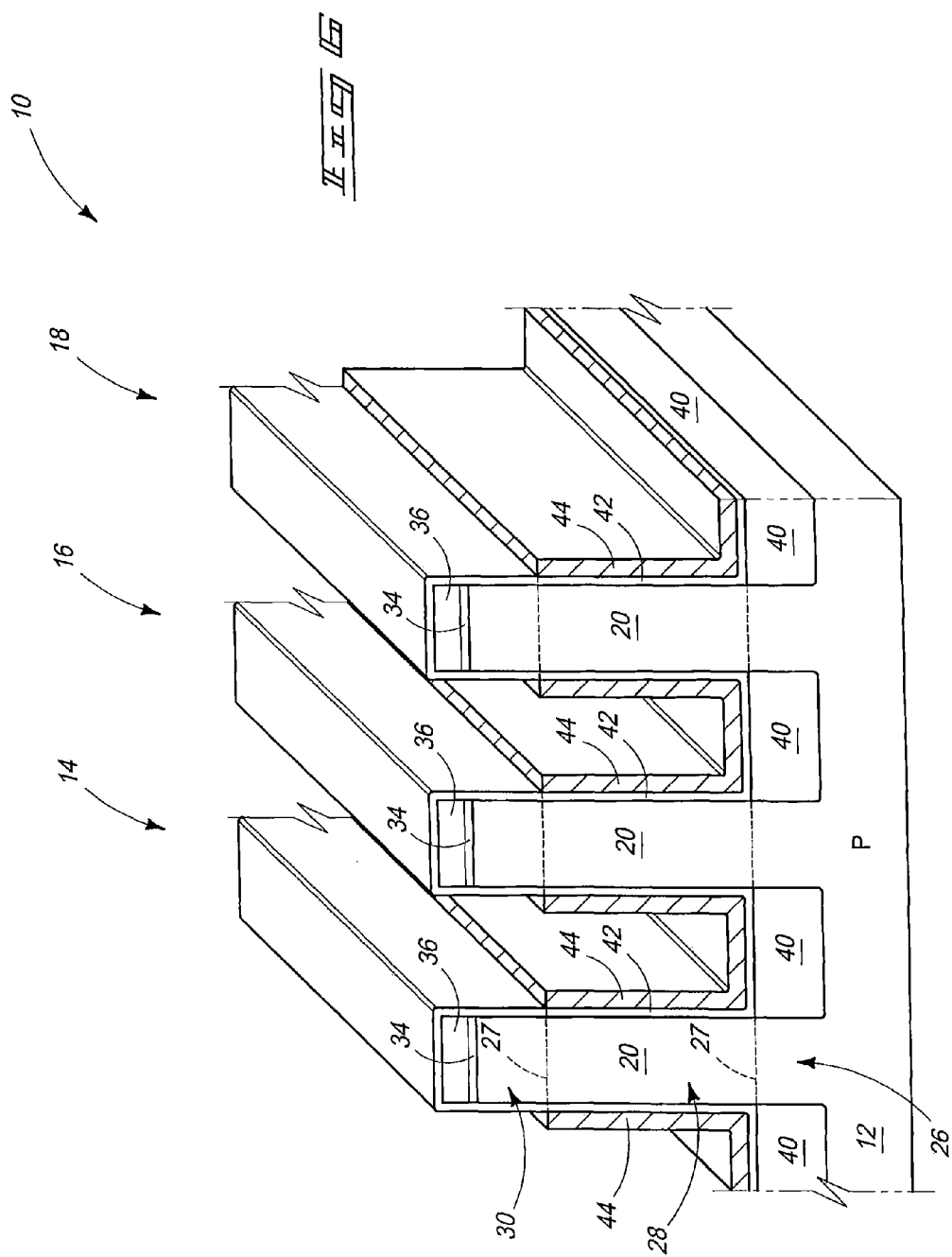

Referring to FIG. 6, sacrificial material 46 (FIG. 5) is removed. Material 46 may be removed with a wet etch selective for material 46 relative to the electrically conductive gate material 44. In the shown embodiment the sacrificial material 46 is etched selectively relative to gate dielectric material 42. In some embodiments the gate dielectric material 42 and the sacrificial material 46 may both comprise silicon dioxide; but the gate dielectric material may be more dense than sacrificial material 46 so that the wet etch utilized to remove sacrificial material 46 is selective for material 46 relative to gate dielectric material 42. In some embodiments the gate dielectric material may comprise a different composition than material 46 (for instance, the gate dielectric material 42 may comprise a high k dielectric material while material 46 comprises silicon dioxide) so that the sacrificial material 46 may be readily removed selectively relative to the gate dielectric material 42.

Figure 7:
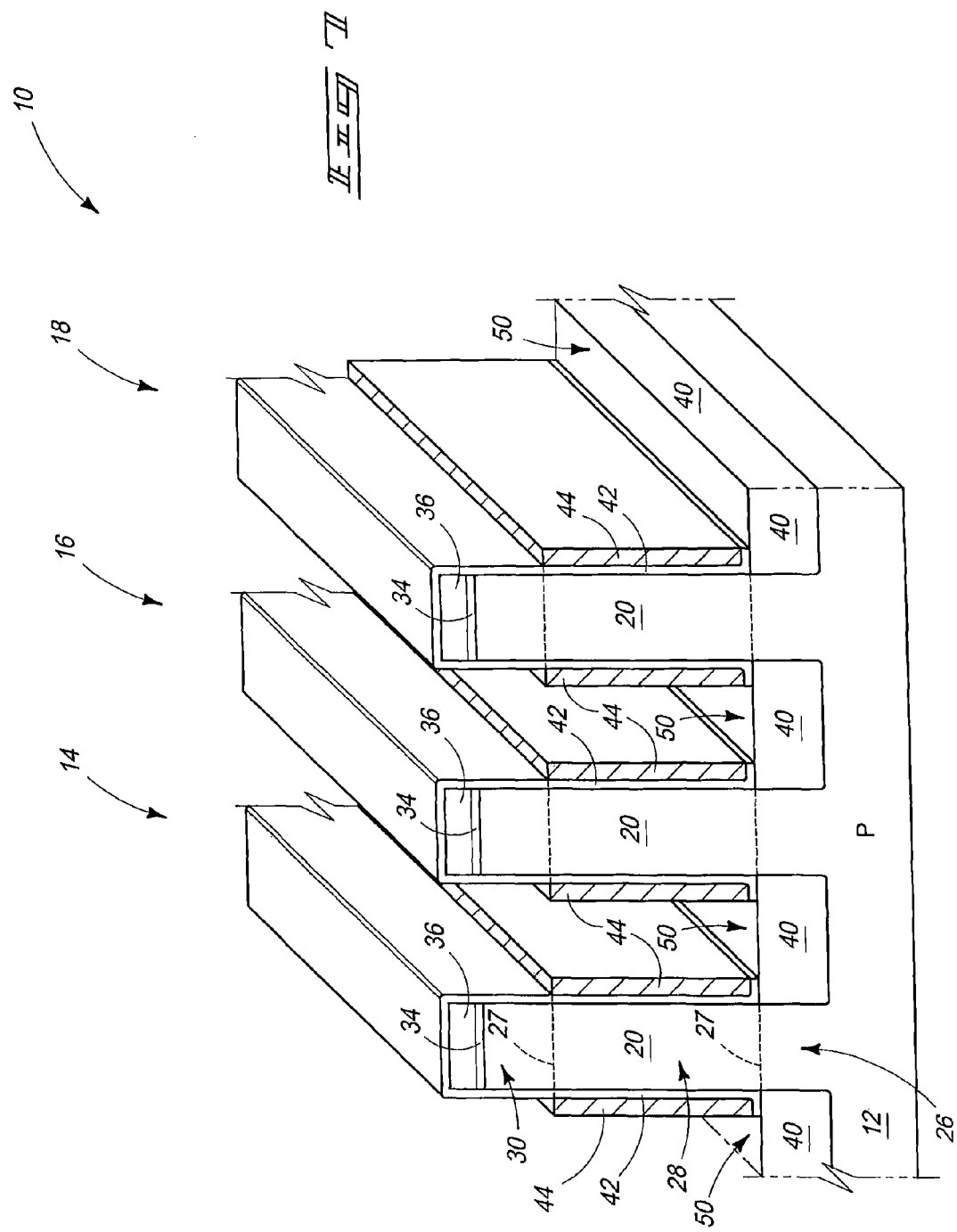

Referring to FIG. 7, a dry etch is utilized to punch through the electrically conductive gate material 44 at the bottoms of the spaces between fins 14, 16 and 18. Such etch is shown to also punch through gate dielectric 42 at the bottoms of the spaces between the fins to form openings 50 extending to oxide 40. In some embodiments the dry etch through the electrically conductive material will not punch through the gate dielectric, and thus will expose an upper surface of the gate dielectric rather than exposing the upper surface of oxide 40. If the dry etch punches through the gate dielectric at the bottoms of the spaces between the fins (as shown) the gate dielectric at the tops of the fins may be protected with a mask (not shown) so that the etch does not remove the gate dielectric from over the fins.

As discussed above with reference to FIG. 2, in some embodiments a thin layer of silicon nitride may be formed over oxide 40 prior to formation of the gate dielectric 42 and the electrically conductive gate material 44. If such thin layer of silicon nitride is utilized, the etch utilized to punch through electrically conductive gate material 44 may also punch through the thin layer of silicon nitride to expose an upper surface of oxide 40 in some embodiments, and in other embodiments the etch utilized to punch through electrically conductive gate material 44 may expose the thin layer of silicon nitride rather than punching through the thin layer of silicon nitride.

If the etch utilized to punch through conductive material 44 exposes other materials besides the upper surface of oxide 40, additional etching may be utilized to punch through such other materials so that the upper surface of oxide 40 is exposed.

The etch utilized to punch through conductive material 44 may reduce a height of the conductive material along the sidewalls of fins 14, 16 and 18. If so, the electrically conductive material 44 along such sidewalls may be left a little higher than desired at the processing stage of FIG. 5 so that the final height of such conductive material at the processing of FIG. 7 (i.e., after the punch-through etch of FIG. 7) is the desired height.

Figure 8:
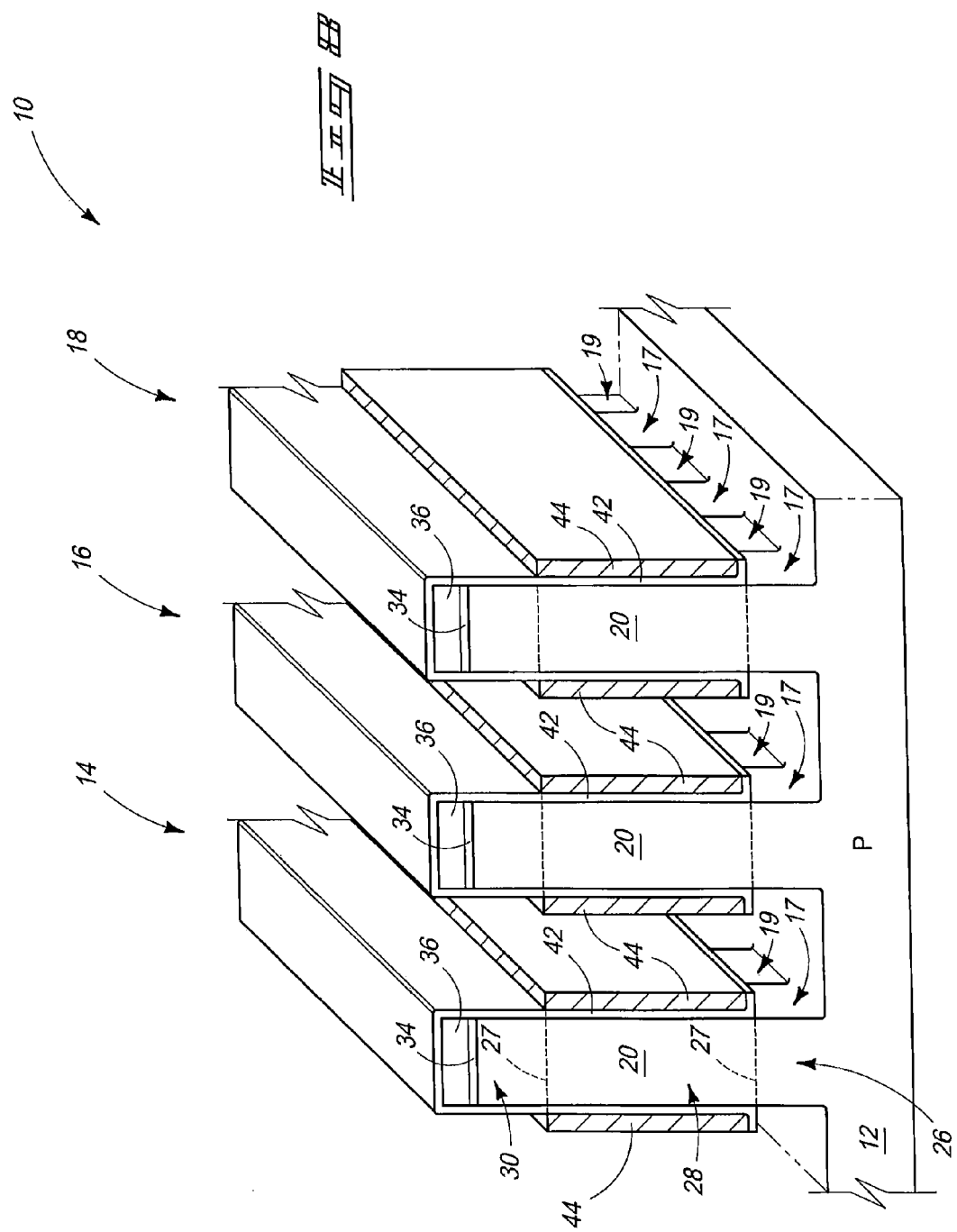

Referring to FIG. 8, oxide 40 (FIG. 7) is removed. In some embodiments the spaces between fins 14, 16 and 18 will be very narrow (in other words, there will be a high aspect ratio). In such embodiments it may be advantageous for the oxide 40 to be easily removed, in that it will be difficult to get mass transport of etchant into the bottoms of the spaces and/or to get mass transport of etch residue out of the spaces. Accordingly, it can be advantageous to utilize the oxide 40 which etches at a rate of at least about 100 angstroms/minute with dilute HF.

As mentioned above, in some embodiments a thin layer of silicon nitride may be formed over the oxide 40 prior to forming the gate dielectric 42 and the electrically conductive gate material 44. A reason for providing such thin layer of nitride may be to protect a bottom surface of the electrically conductive gate material, and a bottom portion of the gate dielectric, during the etching utilized to remove the oxide 40.

Figure 9:
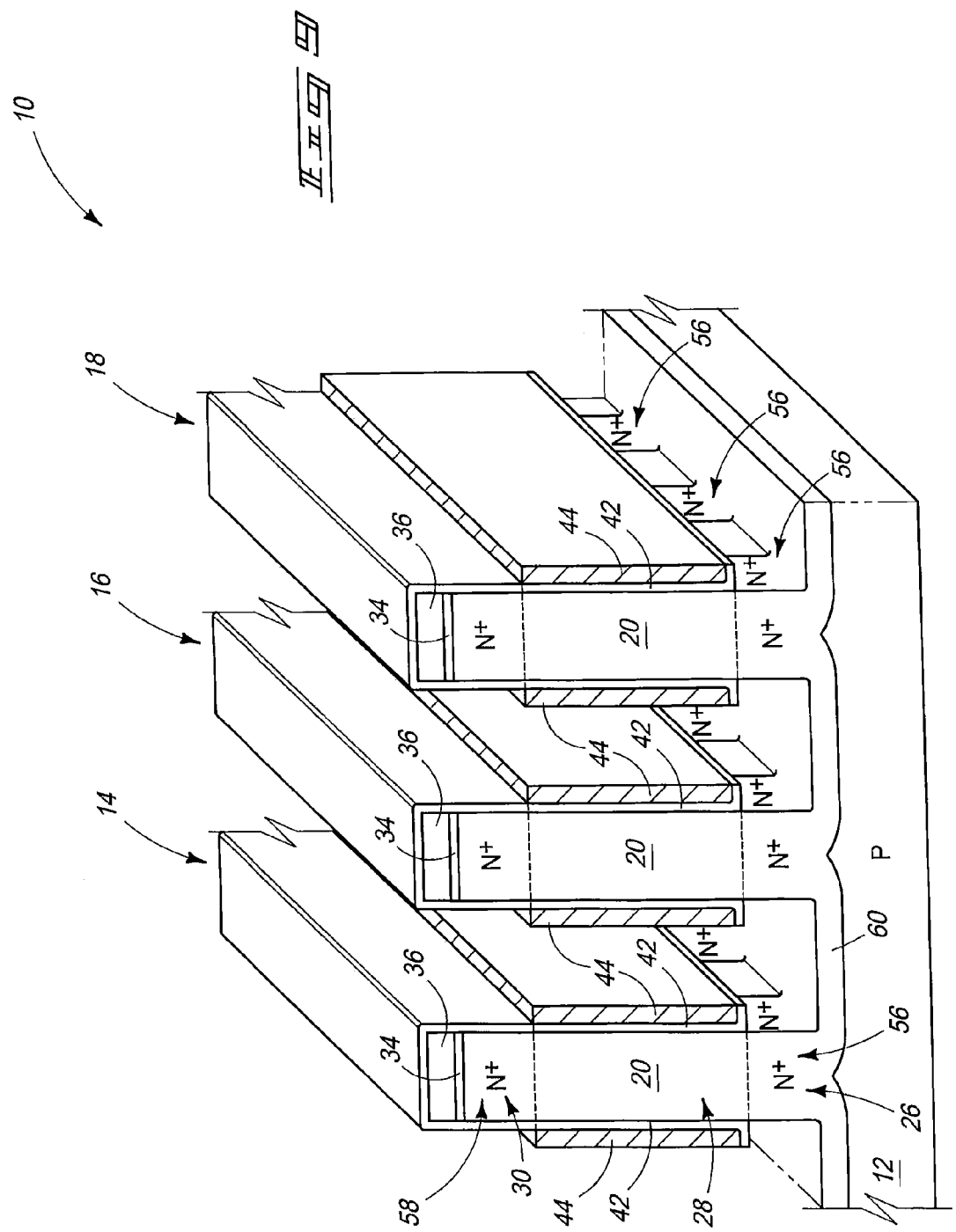

Referring to FIG. 9, n-type dopant is implanted into exposed segments 26 of vertical transistor pillars 17 to form bottom source/drain regions 56 within the bottom source/drain segments.

In the shown embodiment top source/drain regions 58 are also formed within the top source/drain segments 30 at the processing stage of FIG. 9. It can be preferred that the top source/drains be formed at a processing stage prior to that of FIG. 9 (for instance, prior to the processing stage of FIG. 1) so that the segments 30 are not covered by the materials 34, 26 and 42 during attempted implanting of dopant to form the top source/drain regions 58. In embodiments in which the top source/drain regions are doped at a processing stage prior to that of FIG. 9, the bottom source drain regions 56 may also be formed at a processing stage prior to that of FIG. 9. In some embodiments the channel segments and top source/drain segments may be doped prior to the processing stage of FIG. 1, while the bottom source/drain segments are doped at the processing stage of FIG. 9.

Although the shown embodiment has substrate 12 background doped with p-type dopant, and the source/drain regions 56 and 58 doped with n-type dopant, in other embodiments the dopants could be reversed so that the substrate is background doped with n-type dopant and the source/drain regions are doped with p-type dopant.

The bottom source/drain regions 56 are all tied together through a doped region 60 that extends across an upper surface of substrate 12 in the shown embodiment.

Figure 10:
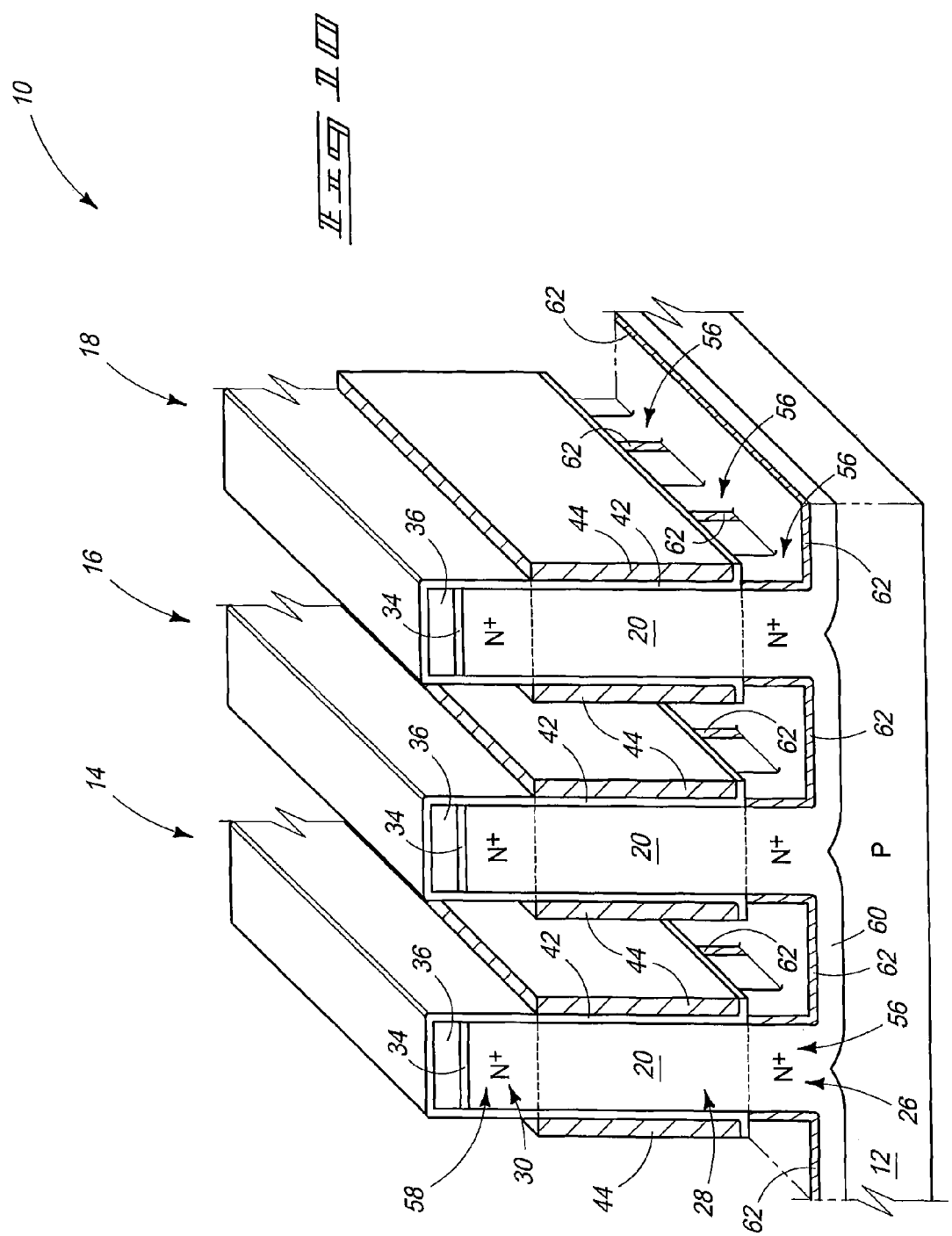

Referring to FIG. 10, silicide 62 is formed across the bottom doped regions 56 and the doped region 60. The silicide may be formed by exposing the doped regions 56 and 60 to one or more of cobalt, nickel and titanium; and accordingly the silicide may comprise, consist essentially of or consist of one or more of cobalt silicide, nickel silicide and titanium silicide. The top source/drain regions 58 may be protected by dielectric material 42 during the silicidation of regions 56 and 60, as shown.

The vertical transistor pillars 17 of FIG. 10 have source/drain regions 56 and 58 therein, with such source/drain regions being separated from one another by a channel region within the channel segment 28. Such vertical transistor pillars in combination with the patterned gate dielectric 42 and conductive gate material 44 form a plurality of vertical transistors. Such vertical transistors may be incorporated into a memory array.

Figure 11:
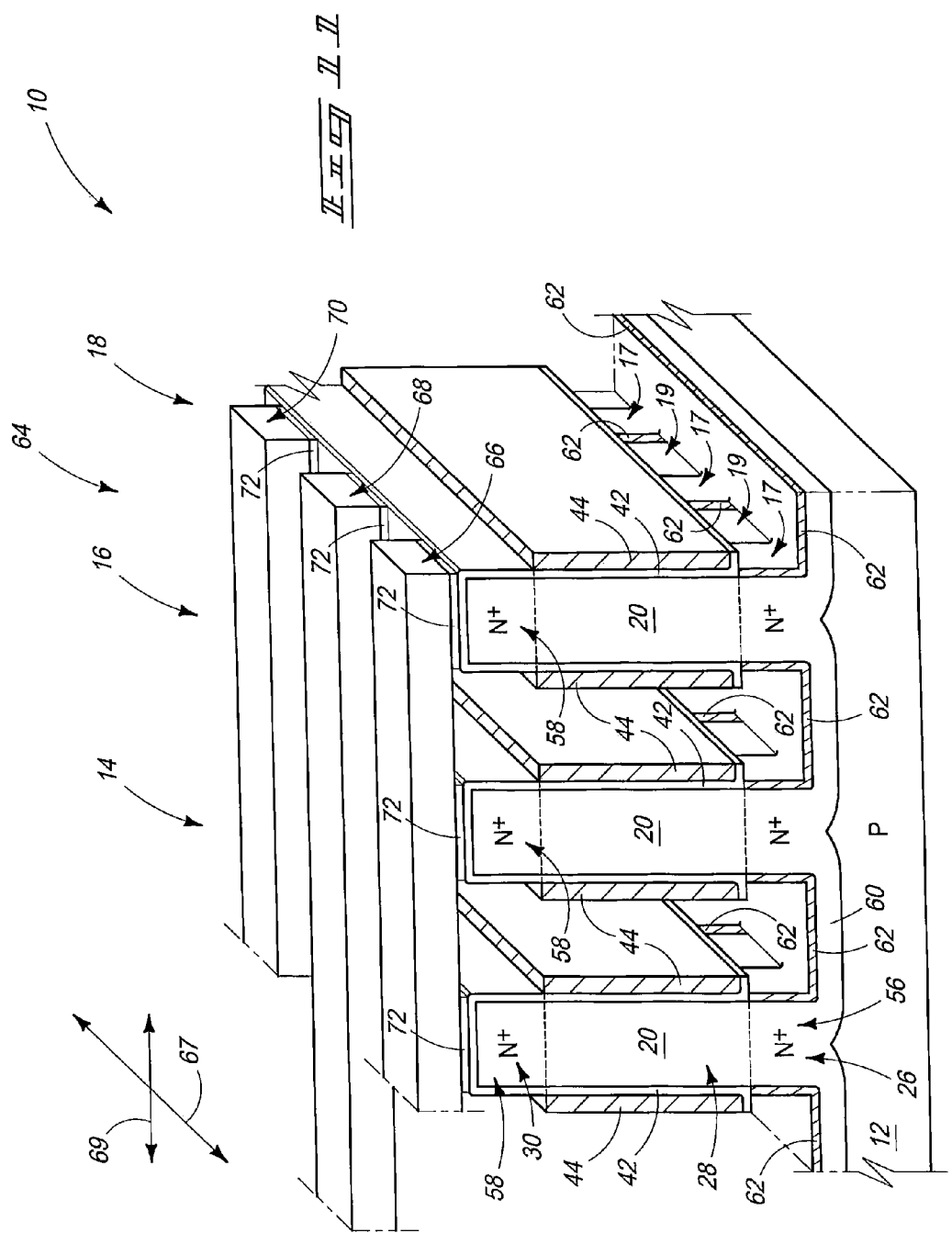

FIG. 11 shows an example memory array 64 comprising the vertical transistors. The protective materials 34 and 36 (FIG. 10) have been removed from over the tops of the fins 14, 16 and 18, and the gate dielectric material 42 has also been removed from over the tops of the fins. A plurality of data/sense lines (such as bitlines) 66, 68 and 70 are formed to extend across the fins 14, 16 and 18. In the shown embodiment the fins extend along a first direction 67, and the lines 66, 68 and 70 extend along a second direction 69 which is substantially orthogonal to the first direction.

Memory cell material 72 is formed between the upper source/drain regions 58 and the data/sense lines. The memory cell material may be of any suitable composition or combination of compositions, and in some embodiments may comprise, consist essentially of, or consist of phase change material, such as chalcogenide. Although not shown, electrical components may be provided between the upper source/drain regions and the data/sense lines in addition to the phase change material. Example electrical components are diodes.

Although the conductive gate material 44 appears to form two gate structures on opposing sides of each fin, in some embodiments the conductive gate material may wrap around at least one of the ends of each fin so that the conductive gate material on the opposing sides of an individual fin is actually comprised by a single continuous gate.

Figure 12:
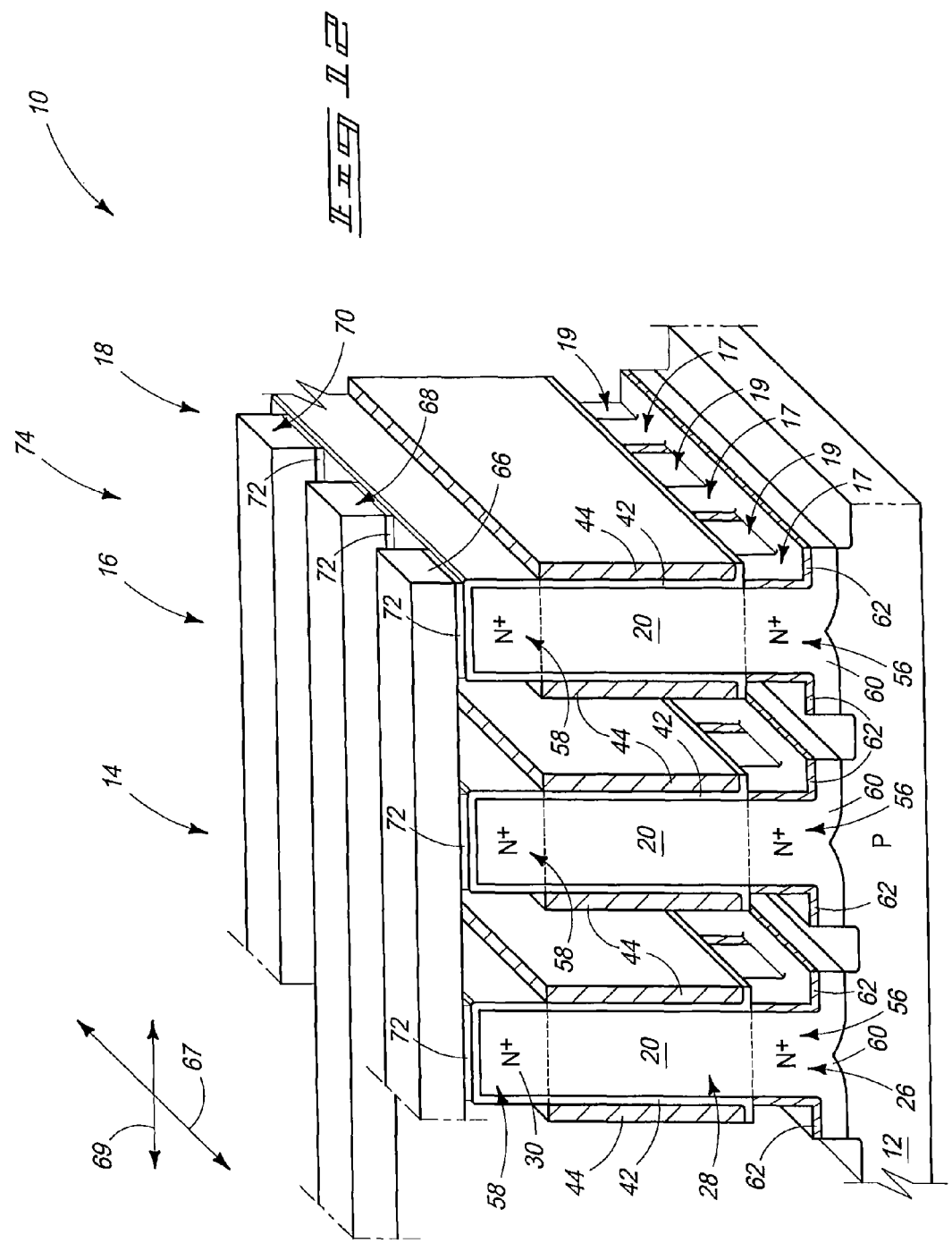
FIG. 12 is a three-dimensional view of a semiconductor construction shown at a process stage of another example embodiment method of forming vertical transistors and a memory array. The process stage of FIG. 12 may follow that of FIG. 10.

FIG. 12 shows another example memory array 74 comprising the vertical transistors of FIG. 10. The memory array 74 of FIG. 12 differs from the memory array 64 of FIG. 11 in that openings are formed through the silicide 62 and through the doped expanse 60 underlying such silicide. Such openings isolate the bottom source/drain regions of adjacent fins (14, 16 and 18) from one another. In the shown embodiment the openings extend through the n-type doped expanse 60 and into the p-type doped region of base 12 to form n-p-n interfaces that electrically isolate the adjacent source/drain regions from one another. In other embodiments the base 12 may be part of an SOI construction, and the openings formed through expanse 60 may penetrate to the insulator of the SOI to electrically isolate the adjacent source/drain regions from one another.

The embodiment of FIGS. 1-10 is an example embodiment in which silicide (specifically the silicide 62 of FIG. 10) is formed after utilization of oxide 40 to offset gate material during fabrication of vertical transistors. In other embodiments the silicide may be formed prior to utilization of the oxide 40 to offset the gate material. FIGS. 13-19 illustrate an example embodiment in which the silicide is formed prior to formation of the oxide 40. Identical numbering will be utilized to describe FIGS. 13-19 as is used above to describe FIGS. 1-10, where appropriate.

Referring to FIG. 13, construction 10 is shown at a processing stage subsequent to that of FIG. 1. The construction of FIG. 13 is shown in side-cross-sectional view, rather than being shown in three-dimensional view, and such side-cross-sectional view will be used to illustrate the remaining figures of this disclosure.

The construction of FIG. 13 comprises a protective liner 80 along exposed surfaces of the semiconductor material 20 of vertical transistor pillars 17, and along the exposed surfaces of the semiconductor material of base 12. The protective liner may comprise one or both of silicon dioxide and silicon nitride. In some embodiments the liner may comprise an underlying layer of silicon dioxide, and a layer of silicon nitride over the silicon dioxide. Dopant has been implanted into base 12 to form a plurality of doped regions 82. In the shown embodiment such regions are formed to be n+ regions, and thus formed to have n-type conductivity dopant implanted to a level of at least about $1 \times 10^{22}$ atoms/cm$^3$. In other embodiments the doped regions 82 may be doped to a lower concentration of dopant. Although the base 12 is shown to be p-type and the doped regions 82 are shown to be n-type, in other embodiments the dopant types of the base and regions 82 could be reversed so that base 12 is n-type and doped regions 82 are p-type.

Referring to FIG. 14, liner 80 is removed from over an upper surface of base 12, while being left along sidewall surfaces of pillars 17. Although source/drain regions 82 are shown being formed before removal of liner 80 from over an upper surface of base 12, in other embodiments the source/drain regions may be implanted after the liner is removed from over such upper surface.

Figure 15:
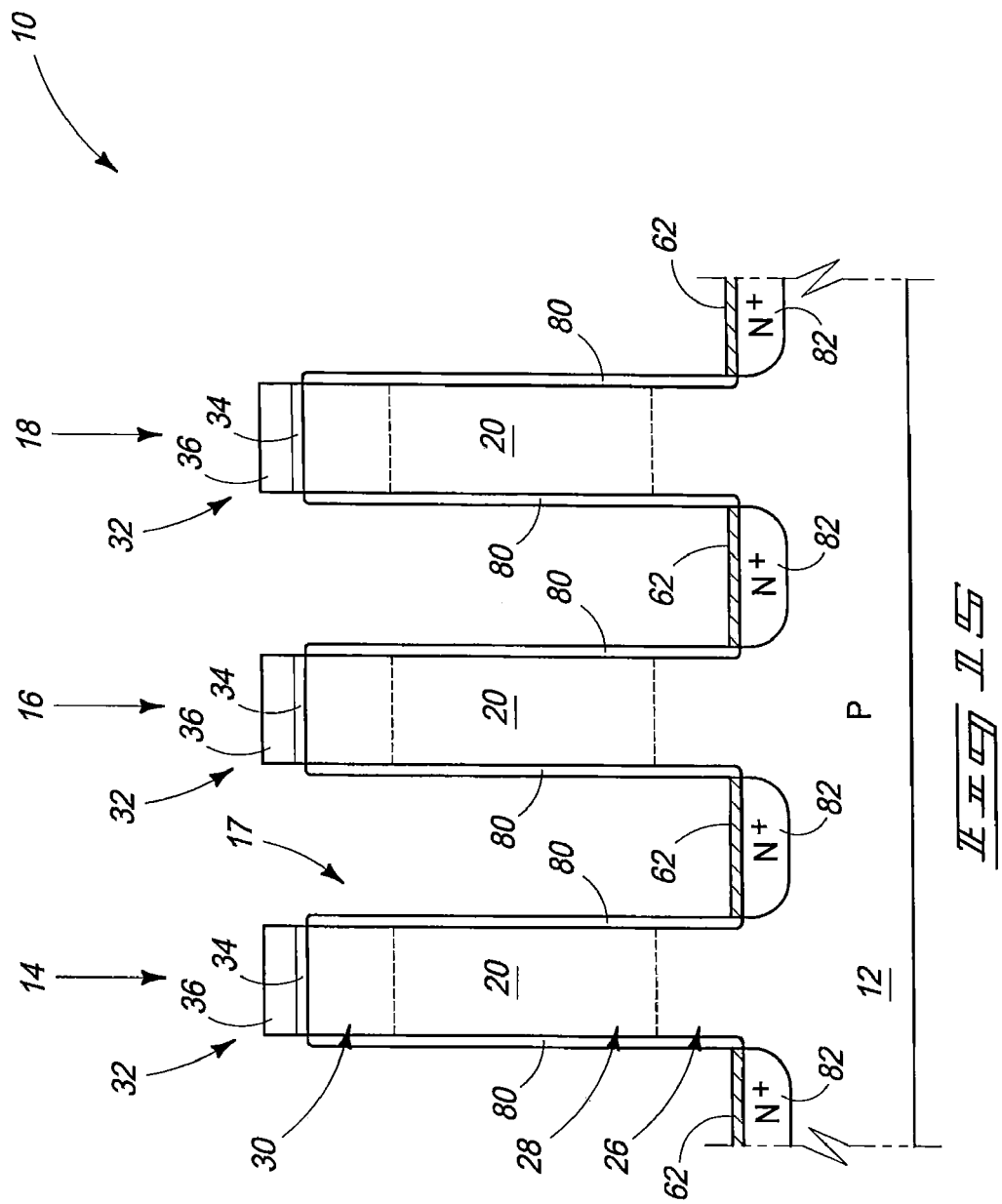

Referring to FIG. 15, silicide 62 is formed along exposed surfaces of the semiconductor material of base 12. The liner 80 protects surfaces of semiconductor material 20 from being converted to silicide during the silicidation of the surfaces of base 12. Silicide 62 may comprise any suitable composition, and in some embodiments may comprise, consist essentially of, or consist of one or more of nickel silicide, cobalt silicide and titanium silicide.

Figure 16:
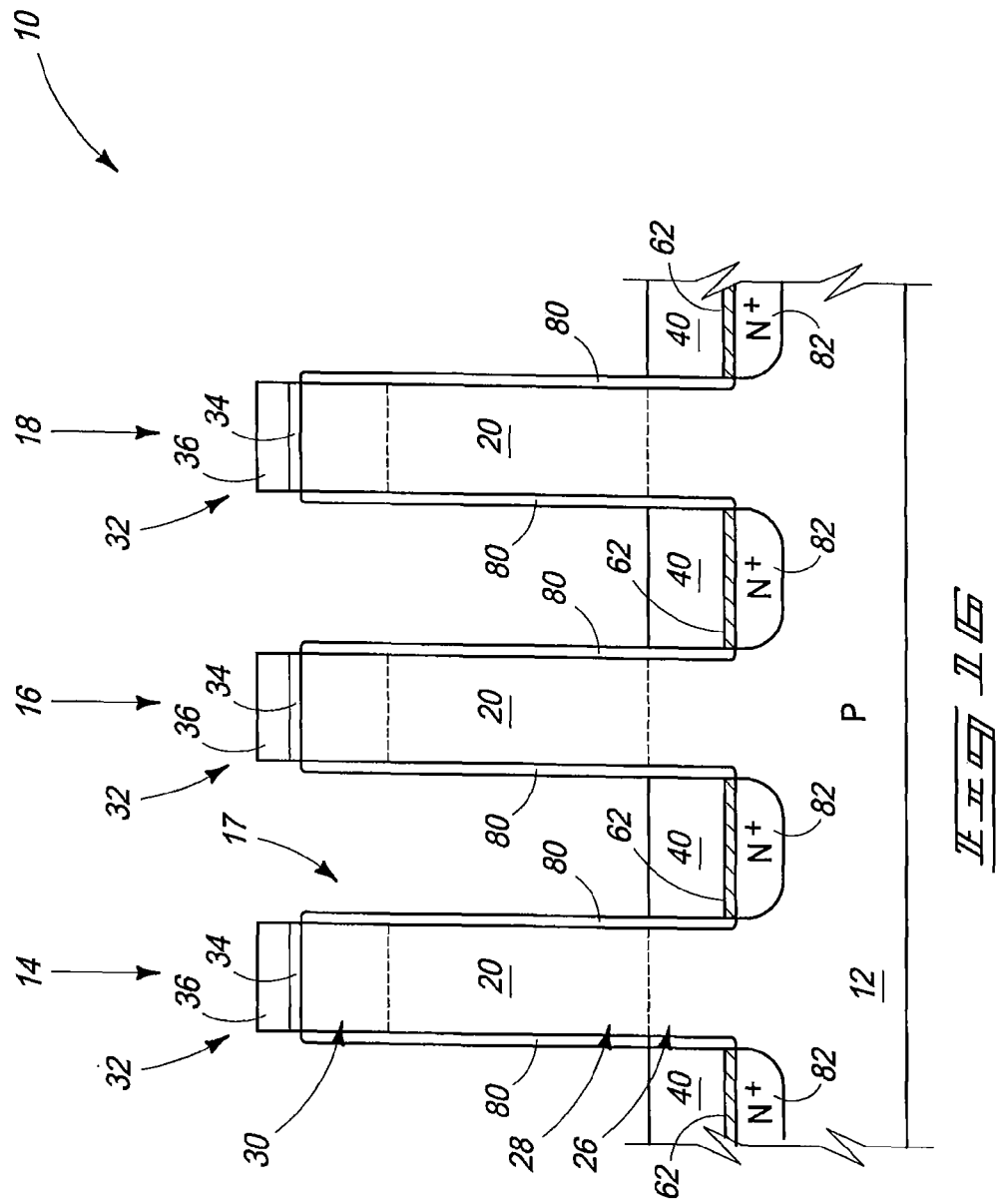
Figure 17:
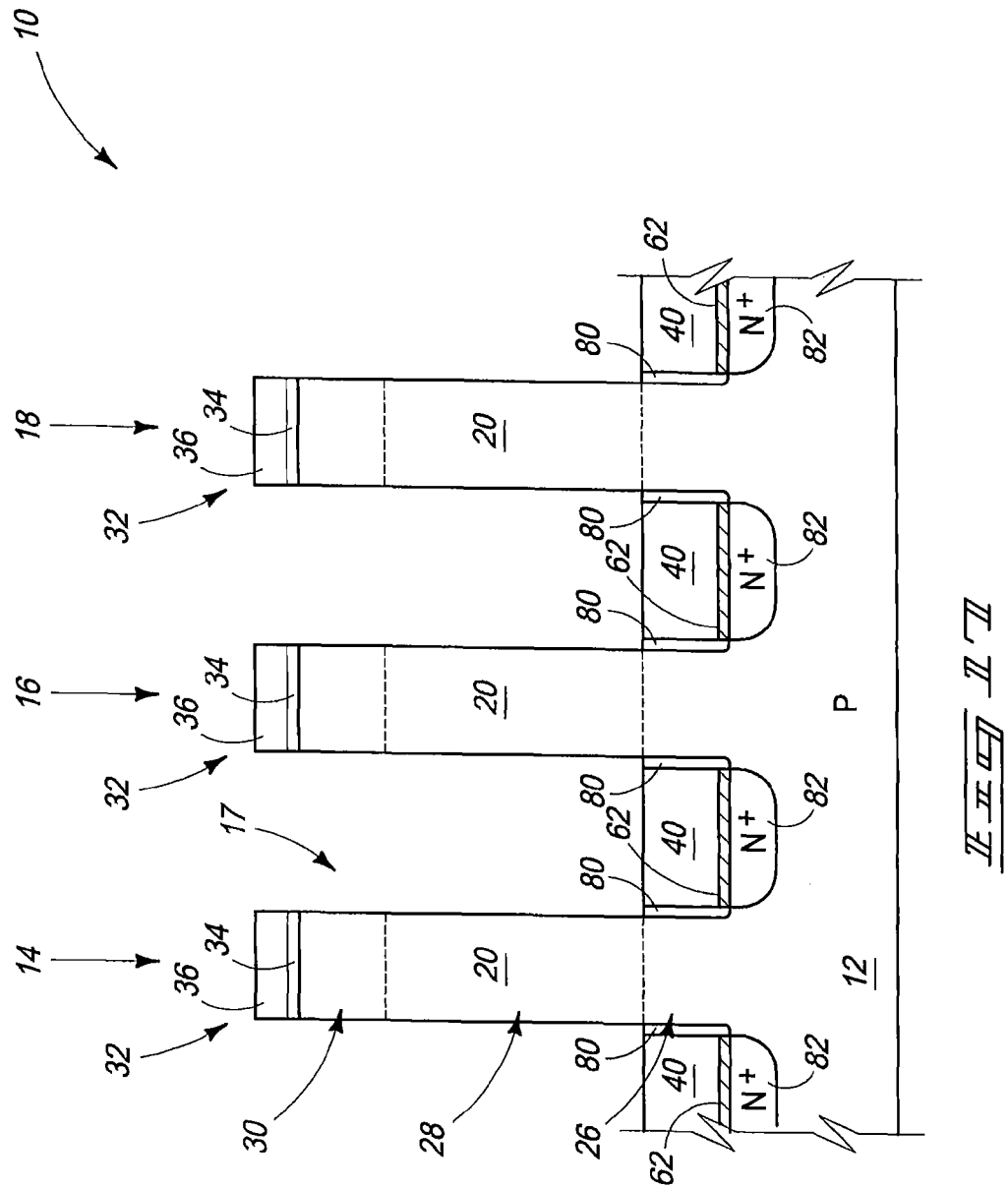

Referring to FIG. 16, oxide 40 is formed at the bottoms of the spaces between fins 14, 16 and 18. Oxide 40 may be formed utilizing any of the methods discussed above with reference to FIG. 2. In the embodiment of FIG. 16 the oxide 40 is formed over silicide 62.

Figure 17:
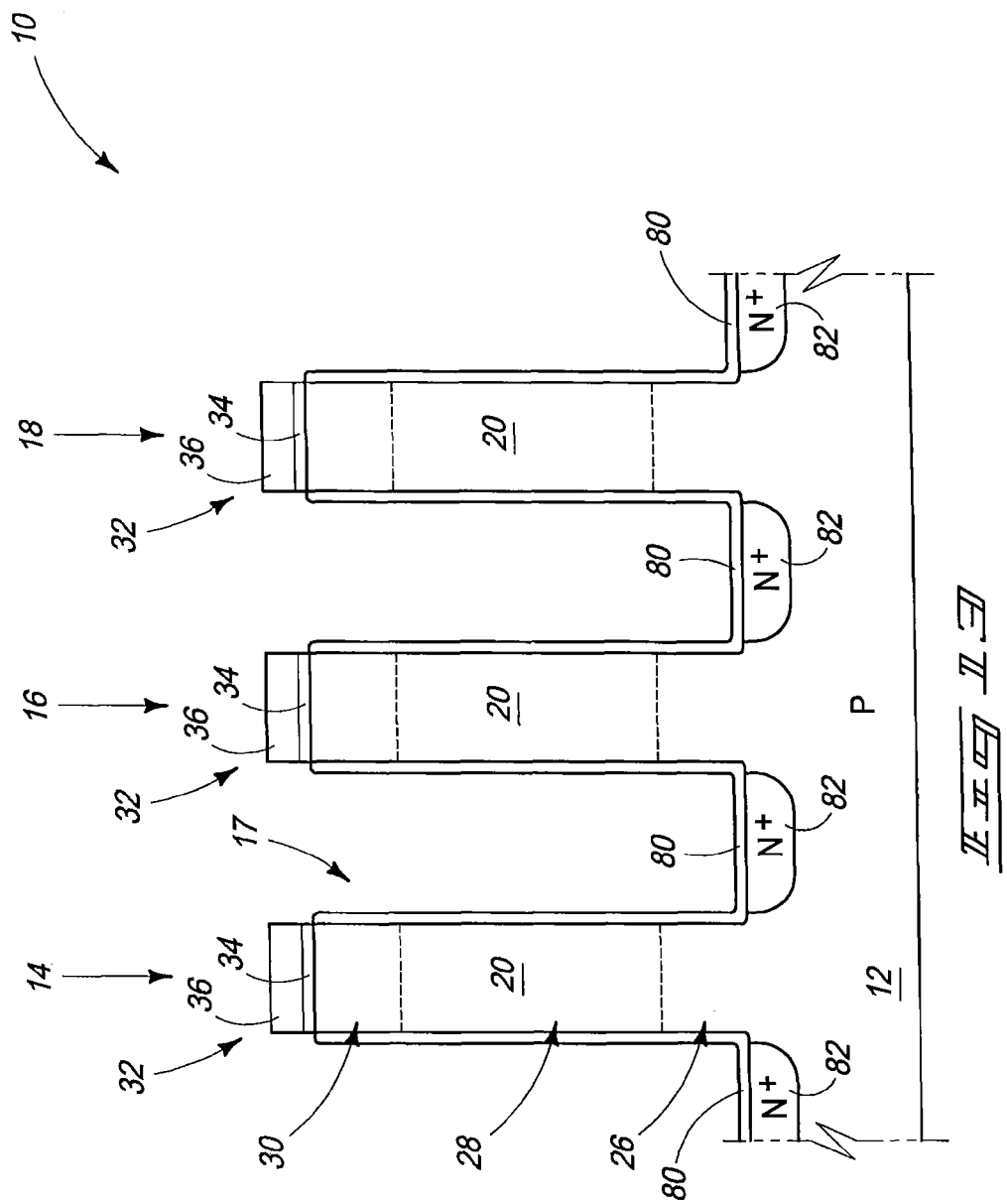
Figure 11:
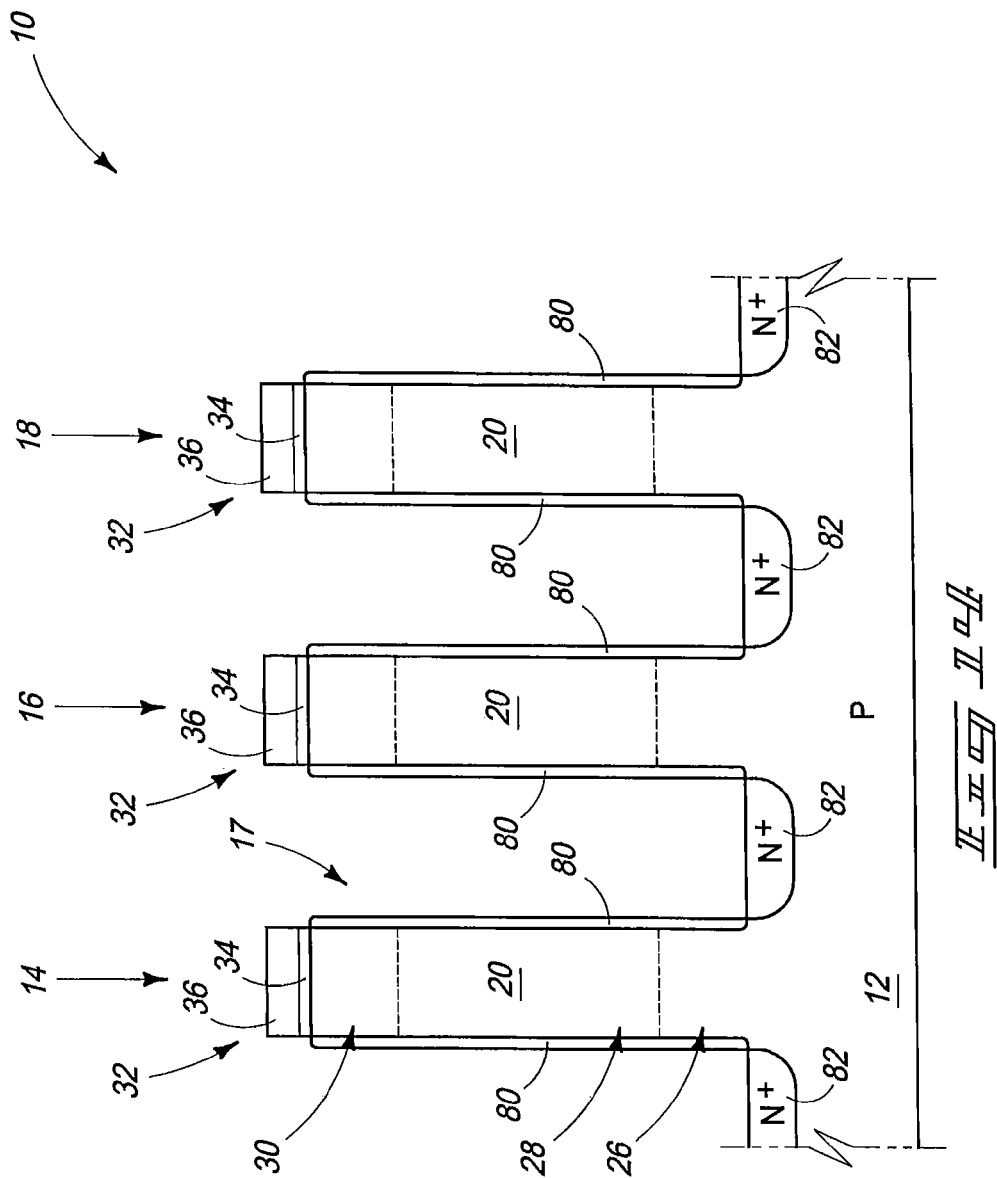

Referring to FIG. 17, portions of liner 80 exposed along sidewalls of pillars 17 are removed. Such exposes the sidewalls of the pillars for subsequent formation of a gate dielectric material thereon (as discussed below with reference to FIG. 18). In some embodiments the liner 80 may comprise a composition suitable for utilization as gate dielectric, and in such embodiments the liner may remain along the sidewalls of the pillars 17 to be incorporated into the gate dielectric.

Referring to FIG. 18, materials 34 and 36 of caps 32 (FIG. 17) are removed. Subsequently, gate dielectric 42 and electrically conductive gate material 44 are formed along exposed sidewalls of pillars 17. In the shown embodiment the gate dielectric 42 extends along sidewalls of the pillars and over top surfaces of pillars, while the electrically conductive gate material 44 is patterned so that it only extends along the channel segments 28 of the pillars. The material 44 may be patterned utilizing processing analogous to that discussed above with reference to FIGS. 3-7 in some embodiments, and in other embodiments may be patterned with any other suitable processing.

Referring to FIG. 19, N-type regions 82 (FIG. 18) are subjected to thermal conditions so that such regions merge together to form the n-type doped expanse 60 extending across base 12, and to form conductively-doped bottom source/drain regions 56. N-type dopant is implanted into top source/drain segments 30 to form top source/drain regions 58, and channel segments 28 are doped to a p-type conductivity type to form channel regions between the top and bottom source/drain regions. At least some of the dopant in the bottom source/drain regions 56, top source/drain regions 58 and channel regions may be provided at a processing stage prior to that of FIG. 19.

The liner 80 is shown remaining along sidewalls of bottom source/drain regions 56. In some embodiments the liner 80 may be removed.

The construction of FIG. 19 may be incorporated into memory arrays, such as, for example, memory arrays analogous to either of the memory arrays described above with reference to FIGS. 11 and 12.

The embodiments of FIGS. 1-19 may be utilized to form memory arrays suitable for incorporation into electronic systems. The memory arrays may be utilized in any of numerous electronic systems, such as, for example, systems incorporated into computers, cars, airplanes, clocks, cellular phones, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of a forming transistors, comprising:
    forming a plurality of spaced-apart fins over a material, each of said fins comprising transistor pillars alternating with dielectric material pillars; the transistor pillars comprising semiconductor material; each of the transistor pillars having three segments; with said three segments being a bottom source/drain segment, a channel segment over the bottom source/drain segment, and a top source/drain segment over the channel segment; and
    forming electrically conductive gate material along the fins while using oxide within spaces along the bottoms of the fins to offset the electrically conductive gate material to be above the bottom source/drain segments of the transistor pillars; the oxide being an oxide which etches at a rate of at least about 100 Å/minute with dilute HF at room temperature.

2. The method of claim 1 further comprising, after forming the electrically conductive gate material, removing the oxide.

3. The method of claim 1 wherein the oxide consists of silicon dioxide.

4. The method of claim 1 further comprising:
    forming a protective liner along sidewalls of the fins, and along the material at bottoms of spaces between the spaced-apart fins;
    after forming the liner, implanting dopant into the material at the bottom of the spaces between the spaced-apart fins to dope said material;
    removing the protective liner from over the doped material to expose the doped material, while leaving the liner along the sidewalls of the fins;
    forming silicide along the exposed doped material;
    after forming the silicide, removing at least some of the liner from along the sidewalls; and
    forming the oxide over the silicide.

5. The method of claim 4 wherein the oxide covers some of the liner and leaves some of the liner exposed, and wherein the exposed liner is removed after forming the oxide and prior to forming the electrically conductive gate material.

6. The method of claim 4 wherein the silicide comprises one or more of cobalt, nickel and titanium.

7. A method of a forming transistors, comprising:
    forming a plurality of spaced-apart fins, each of said fins comprising transistor pillars alternating with dielectric material pillars; the transistor pillars comprising semiconductor material; each of the transistor pillars having a bottom source/drain segment, a channel segment over the bottom source/drain segment, and a top source/drain segment over the channel segment;
    forming oxide within spaces between the fins, the oxide protecting the bottom source/drain segments of the transistor pillars and leaving the other segments of the transistor pillars exposed;
    forming electrically conductive gate material along the fins and over the oxide; the electrically conductive gate material being formed to be along the channel segments of the transistor pillars and to leave the top source/drain segments exposed;
    removing the oxide; and
    after removing the oxide, implanting dopant into the bottom source/drain segments.

8. The method of claim 7 wherein the oxide consists of silicon dioxide and etches at a rate of at least about 100 Å/minute with dilute HF at room temperature.

9. The method of claim 7 further comprising forming a silicon nitride layer over the oxide prior to forming the electrically conductive gate material.

10. The method of claim 7 wherein the oxide is formed with a bottom-up deposition process in the spaces between the fins.

11. The method of claim 7 wherein the forming the oxide comprises:
    deposition of the oxide to a first elevational level in the spaces between the fins; and
    recessing of the oxide to reduce the elevational level of the oxide within the spaces between the fins.

12. A method of a forming transistors, comprising:
    forming plurality of spaced-apart fins, each of said fins comprising transistor pillars alternating with dielectric material pillars; the transistor pillars comprising semiconductor material; each of the transistor pillars having a bottom source/drain segment, a channel segment over the bottom source/drain segment, and a top source/drain segment over the channel segment;
    forming first sacrificial material within spaces between the fins, the first sacrificial material protecting the bottom source/drain segments of the transistor pillars and leaving the other segments of the transistor pillars exposed; the first sacrificial material being an oxide which etches at a rate of at least about 100 Å/minute with dilute HF at room temperature;
    forming gate material along the fins and over the first sacrificial material; the gate material being formed to be along sidewalls of the fins and to extend over upper surfaces of the fins; the gate material partially filling the spaces between the fins and thus narrowing the spaces between the fins;

forming second sacrificial material within the narrowed spaces between the fins to fill such narrowed spaces;

etching back the second sacrificial material and the gate material to expose the top source/drain segments;

after etching back the second sacrificial material and the gate material, removing the second sacrificial material;

removing the first sacrificial material; and implanting dopant into the bottom source/drain segments.

13. The method of claim 12 wherein the second sacrificial material comprises silicon dioxide.

14. The method of claim 12 wherein the etching back of the second sacrificial material and the gate material occurs in a single etch.

15. A method of a forming a memory array, comprising:

forming a plurality of spaced-apart fins, each of said fins comprising transistor pillars alternating with dielectric material pillars; each of the vertical transistor pillars comprising a bottom source/drain segment, a channel segment over the bottom source/drain segment, and a top source/drain segment over the channel segment;

forming oxide within spaces between the fins, the oxide protecting the bottom source/drain segments of the transistor pillars and leaving the other segments of the transistor pillars exposed; the oxide etching at a rate of at least about 100 Å/minute with dilute HF at room temperature;

forming gate material along the fins and over the oxide; the gate material being formed to be along the channel segments of the vertical transistor pillars and to leave the top source/drain segment exposed;

implanting dopant into the bottom source/drain segments, the bottom source/drain segments of individual fins being electrically tied to one another;

implanting dopant into the top source/drain segments; and forming bitlines across the top source/drain segments, the fins extending along a first horizontal direction and the bitlines extending along a second horizontal direction which is substantially orthogonal to the first horizontal direction.

16. The method of claim 15 further comprising removing the oxide.

17. The method of claim 15 further comprising forming silicide along the doped bottom source/drain segments.

18. The method of claim 15 further comprising forming memory cell material between the top source/drain segments and the bitlines.

19. The method of claim 15 wherein the implanting of dopant into the bottom source/drain segments forms conductively-doped expanses that extend along the bottoms of the spaces and between adjacent fins, and further comprising removing the oxide and etching through the conductively-doped expanses to electrically separate the bottom source/drain segments of adjacent fins from one another.

20. The method of claim 19 further comprising:

forming silicide along the conductively-doped expanses; and etching through the silicide.

21. The method of claim 19 wherein the dopant implanted into the bottom source/drain segments is of a first conductivity type; wherein the bottom source/drain segments are directly over a semiconductor material doped to a second conductivity type; and wherein the etching through the conductively-doped expanses punches through the expanses to the semiconductor material doped to the second conductivity type.

22. The method of claim 19 wherein the conductively-doped expanses are over insulative material of a semiconductor-on-insulator construction, and wherein the etching through the conductively-doped expanses punches through the expanses to the insulator of the semiconductor-on-insulator construction.

* * * * *